(12) United States Patent
Többen et al.

(10) Patent No.: US 6,261,937 B1
(45) Date of Patent: Jul. 17, 2001

(54) METHOD FOR FORMING A SEMICONDUCTOR FUSE

(75) Inventors: Dirk Többen; Stefan J. Weber; Axel Brintzinger, all of Fishkill, NY (US)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/105,107

(22) Filed: Jun. 24, 1998

(51) Int. Cl.[7] .................................................. H01L 21/44
(52) U.S. Cl. ........................ 438/601; 438/132; 438/467
(58) Field of Search ................................... 438/132, 210, 438/215, 238, 281, 333, 467, 601, 622

(56) References Cited

U.S. PATENT DOCUMENTS

| | | | |
|---|---|---|---|
| 5,060,045 | * 10/1991 | Owada et al. | 357/45 |
| 5,844,295 | * 12/1998 | Tsukude et al. | 257/529 |
| 5,970,346 | * 10/1999 | Liaw | 438/281 |
| 5,989,784 | * 11/1999 | Lee et al. | 430/316 |

* cited by examiner

Primary Examiner—Stephen D. Meier
Assistant Examiner—Jeff Vockrodt
(74) Attorney, Agent, or Firm—Stanton C. Braden, Esq.

(57) ABSTRACT

A method for forming a semiconductor integrated circuit having a fuse and an active device. A dielectric layer is formed over the fuse and over a contract region of the active device. Via holes are formed through selected regions of the dielectric layer exposing underlying portions of the fuse and underlying portions of a contact region of the active device. An electrically conductive material is deposited over the dielectric layer and through the via holes onto exposed portions of the fuse and the contact region. Portions of the electrically conductive material deposited onto the fuse are selectively removed while leaving portions of the electrically conductive material deposited onto the contact region of the active device. A fill material is disposed in the one of the fuse, a bottom portion of such filling material being spaced from the fuse.

12 Claims, 2 Drawing Sheets

METHOD FOR FORMING A SEMICONDUCTOR FUSE

BACKGROUND OF THE INVENTION

This invention relates generally to fuses and more particularly to fuses used in semiconductor integrated circuits.

As is known in the art, many modern semiconductor integrated circuits include fuses to protect sensitive parts during the manufacturing process as well as for the activation of redundant circuits, such as redundant memory cells in the case of Dynamic Random Access Memories (DRAMs). There are typically two types of fuses; a laser-blowable fuse, and an electrically (e.g. current) blowable-fuse. Electrically blowable fuses provide advantage over laser-blowable fuses in terms of size.

One technique used in the fabrication of an electrically blowable fuse is to cover the fuse material with surrounding dielectric material, such as silicon dioxide or BPSG material. After the fuse material has blown however, over time the material may migrate (i.e., heal) and provide an unwanted short circuit condition. Further, when the fuse is blown, mechanical forces in the surrounding dielectric are produced which may generate cracks in the dielectric material as it expands from the explosion of the fuse material. These explosion effects may damage other neighboring fuses.

In another technique, a cavity is formed over the fuse. Thus, when the fuse is blown to provide a open circuit, the fuse material becomes somewhat contained within the provided cavity. With DRAMs, these fuses are typically doped polycrystalline silicon having an upper layer of tungsten silicide. Further, these fuses are typically formed with the formation of the gate electrodes of the DRAM cells. While the gate electrodes are formed over active regions in the semiconductor, the fuses are typically formed over silicon dioxide isolation regions used to electrically isolate the active regions. The cavity is sometimes formed by a specific photolithographic step which opens an aperture in a mask over the fuse area while the remainder of the chip (i.e., the active regions) is protected from the series of dry and wet etch steps used to form the cavity. More particularly, the cavity is typically formed selectively between the fuse material and an surrounding insulator, typically silicon nitride. Thus, the typical gate structure (or gate stack) and fuse both include a conductor made up of doped polycrystalline silicon/tungsten silicide encapsulated in a silicon nitride insulator which is selective removed over the fuse to form a cavity for the fuse blown material. This cavity is typically sealed with a plasma deposited silicon dioxide leaving a pocket, i.e.e, the cavity described above, for the blown fuse material. In any event, this later technique requires a separate masking step in the fabrication process.

SUMMARY OF THE INVENTION

In accordance with the invention, a method is provided for forming a fuse for semiconductor integrated circuit. The circuit has an active device. The method includes forming a fuse and an active device in different regions of a semiconductor substrate. A dielectric layer is formed over the fuse and over a contact region of the active device. Via holes are formed through selected regions of the dielectric layer exposing underlying portions of the fuse and underlying portions of a contact region of the active device. An electrically conductive material is deposited over the dielectric layer and through the via holes onto exposed portions of the fuse and the contact region. Portions of the electrically conductive material deposited onto the fuse are selectively removed while leaving portions of the electrically conductive material deposited onto the contact region of the active device.

With such method, the same masking step is used to form a cavity for the fuse and contact via holes for the active device.

In accordance with another feature of the invention, a second dielectric layer is formed over the electrically conductive material. A second via hole is formed through the second dielectric layer exposing an underlying portion of a portion of the electrically conductive material deposited onto the contact region of the active device. A metalization layer is formed over the second dielectric layer of a material different from material of the electrically conductive material. A portion of such metalization layer is deposited through the second via onto the exposed underlying portion of the electrically conductive material deposited onto the contact region of the active device.

In accordance with another feature of the invention, a third via hole through the second dielectric over the fuse and over a portion of the metalization layer. An etch is brought into contact with the second dielectric and through the second and third via holes into contact with the exposed portion of the electrically conductive material deposited onto the fuse and into contact with an exposed portion of the metalization layer. The etch selectively removes the exposed portion of the electrically conductive material deposited over the fuse and leaves substantially un-etched the portion of the metalization layer deposited exposed by the second via hole.

In accordance with another feature of the invention, a fill material is deposited into an upper portion of the second via hole over fuse with a bottom portion of such filing material being spaced from the fuse.

In accordance with still another feature of the invention, the electrically conductive material is tungsten and the metalization layer is aluminum.

In accordance with yet another feature of the invention, a semiconductor integrated circuit is provided having a semiconductor substrate with a fuse and an active device disposed in different regions of the semiconductor substrate. The active device has an electrically conductive gate electrode. A dielectric layer is disposed over the fuse and over the gate electrode. The dielectric layer has via holes through selected regions of the dielectric layer exposing underlying portions of the fuse and underlying portions of a source/drain contact region of the active device. A first metalization layer having an electrically conductive material is disposed over the dielectric layer and through one of the via holes, such electrically conductive material having a portion thereof disposed on the exposed portion of the source/drain contact region. A second dielectric layer is disposed over the electrically conductive material, such second dielectric material having second via holes through the second dielectric layer, one of such second via holes being disposed over one of the first via holes to expose and underlying portion of the fuse and another one of such second via holes exposing an underlying second portion of the electrically conductive material. A fill material is disposed in the one of the second via holes disposed over the fuse, a bottom portion of such filling material being spaced from the fuse.

BRIEF DESCRIPTION OF THE DRAWING

Other features of the invention, as well as the invention itself, will become more readily apparent when read together with the accompanying drawings, in which.

DESCRIPTION OF THE PREFERRED EMBODIMENTS

Figure 1A:
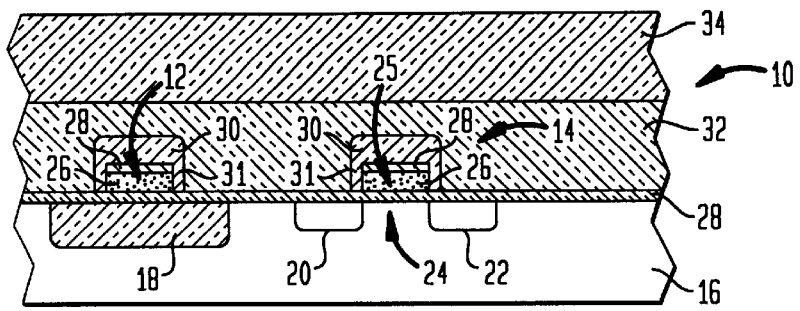
FIGS. 1A–1G are diagrammatical cross sectional sketches of a semiconductor integrated circuit having an active device and fuse at various stages in the fabrication of such circuit.

Referring now to FIGS. 1A–1G, a method is shown forming a semiconductor integrated circuit 10 having a fuse 12 and an active device 14. The method includes forming the fuse 12, here an electrically blowable, fuse and the active device 14, here a MOSFET, in different regions of a semiconductor substrate 16 using conventional processing. The regions for the fuse 12 and the active device 14 are electrically isolated by silicon dioxide, here by a shallow trench silicon dioxide region 18. Here, the active device is, as noted above, a MOSFET having source and drain regions 20, 22, respectively, and a gate region 24 therebetween. The fuse 12 is formed over the silicon dioxide shallow trench isolation region 18, as indicated. Here, the MOSFET active device 14 includes a gate electrode (i.e., stack) 25 made of doped polycrystalline layer 26 disposed over a thin gate silicon dioxide layer 18. A more electrically conductive layer 28, here tungsten silicide, is disposed over the doped polycrystalline silicon layer 26. An insulating layer of silicon nitride is disposed over the tungsten silicide layer 28. A photoresist layer, not shown, is deposited over the silicon nitride layer in the region thereof where the gate electrodes are to be formed. The portions of the silicon nitride layer, tungsten silicide layer 28 and doped polycrystalline layer 26 exposed by the mask are etched down to the silicon dioxide layer 28. It is noted that the etch will leave the sidewalls of the gate electrode exposed. A conformal second layer of silicon nitride is deposited over the structure. Portions of the second silicon nitride layer are removed with a reactive ion etch with portions of the second silicon nitride layer remaining on the sidewalls of the gate electrode to form sidewall spacers in a conventional manner. Thus, the first deposited silicon nitride layer forms a cap nitride 30 and the second silicon nitride layer forms sidewall spacers 31.

A dielectric layer 32, here borophosphoro silicate glass (BPSG) is deposited over the gate stack 25 and over the fuse 12, reflowed, planarized with a chemical mechanical polishing process, followed by a dielectric layer 34 of here TEOS.

Figure 1B:
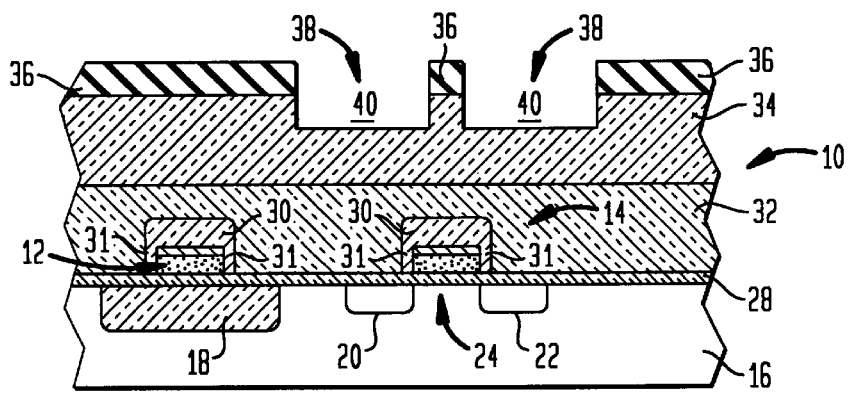

Referring now to FIG. 1B, a photoresist layer 36 is formed over the surface of the dielectric layer 34 and is patterned as shown using conventional photolithography to have openings 38 formed therein, as shown in FIG. 1B. The patterned photoresist layer 36 is used as an etch mask to enable formation of trenches 40 in the upper surface portion of the dielectric layer 34, as shown. It is noted that the trenches 34 are aligned over the source and drain regions 20, 22.

Figure 1C:
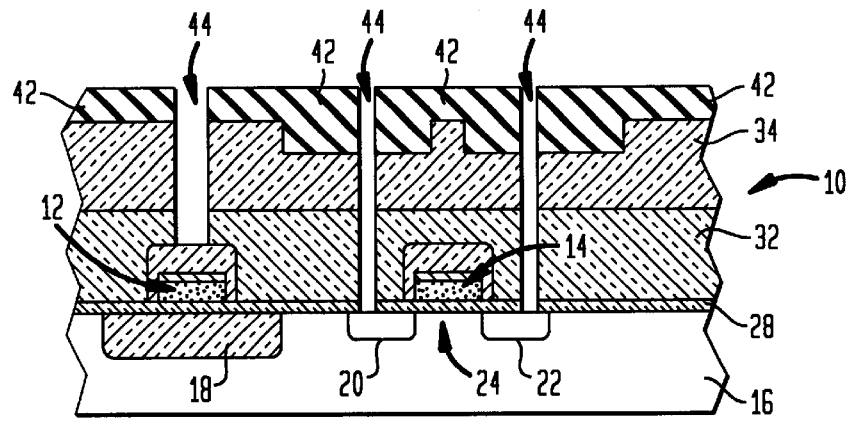

Referring now also to FIG. 1C, the photoresist mask 36 (FIG. 1B) is removed and replaced with another photoresist layer 42. The photoresist layer 42 is patterned as shown to enable etching of via holes 44 through the exposed underlying portions of the dielectric layers 34, 32 and the silicon dioxide gate oxide layer 28 over the source and drain regions 20, 22, as indicated. Thus, via holes 44 are formed through selected regions of the dielectric layers 32, 34 exposing underlying portions of the fuse 12 and underlying portions of a source/drain contact region 20, 22 of the MOSFET active device 14. It should be noted that the via holes 44 may be formed prior to the formation of the trenches 40.

Figure 1D:
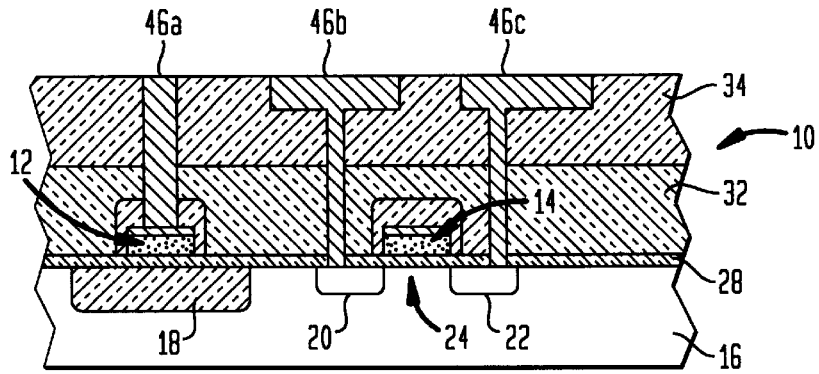

Next, referring also to FIG. 1D, the photoresist layer 42 (FIG. 1C) is removed and an electrically conductive material 40a, 40b, 40c, here tungsten, is deposited over the surface of the dielectric layer 34. It is noted that the electrically conductive material 46a, 46b, 46c is deposited through the via holes 44 and into the trenches 38 (FIG. 1B), as indicated. The upper portions of the electrically conductive material 46a, 46b, 46c, not shown, are removed using any process, such as chemical mechanical polishing (CMP) to form a planar surface as indicated in FIG. 1D. Thus, it is noted that a dual damascene process is used to form the source/drain contacts 46b, 46c and that simultaneously therewith the same material 46a is deposited onto the fuse 12. It is also noted that the portions 46a of the tungsten deposited onto the fuse 12 are electrically isolated from the source/drain electrical contact portions 46b, 46c by portions of the dielectric layers, 32, 34, as indicated.

Figure 1E:
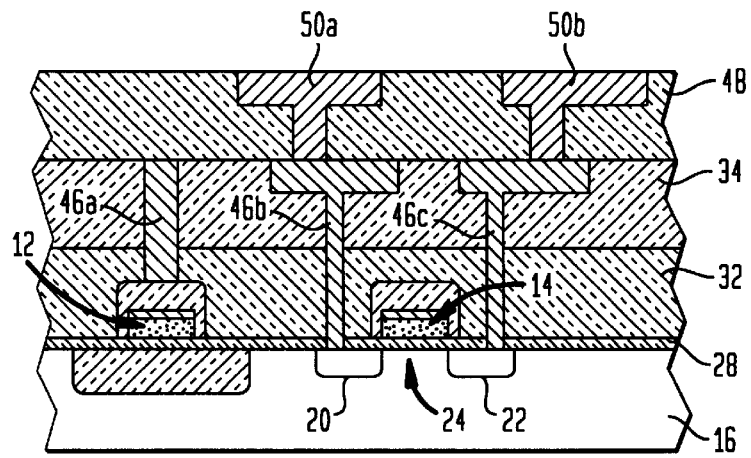

Referring now to FIG. 1E, a dielectric layer 48, here TEOS, is deposited over the surface of the structure, i.e., on the dielectric layer 34 and over upper portions of tungsten material 46a, 46b, 46c, as shown. The dielectric layer 48 is patterned in a manner similar to that used to patter the dielectric layer 48. Here, however, trenches and via holes are aligned with the source and drain electrical contacts provided by the tungsten material 46b, 46c, as indicated.

Next, a first metalization layer 50a, 50b is formed. Here, an electrically conductive material, here aluminum, used for the metalization layer 50a, 50b is different from the electrically conductive material, here, as noted above, tungsten, used for the electrically conductive material 46a, 46b, 46c. The aluminum layer 50a, 50b is deposited over the surface of the structure and then planarized as shown using, for example, chemical mechanical polishing to produce the structure shown in FIG. 1E. It is noted that the portion 50a, 50b of such first level of metalization is deposited through vias in dielectric layer 48 onto the exposed underlying portion of the tungsten material 46b, 46b used to provide the source and drain electrical contacts to the source and drain regions.

Figure 1F:
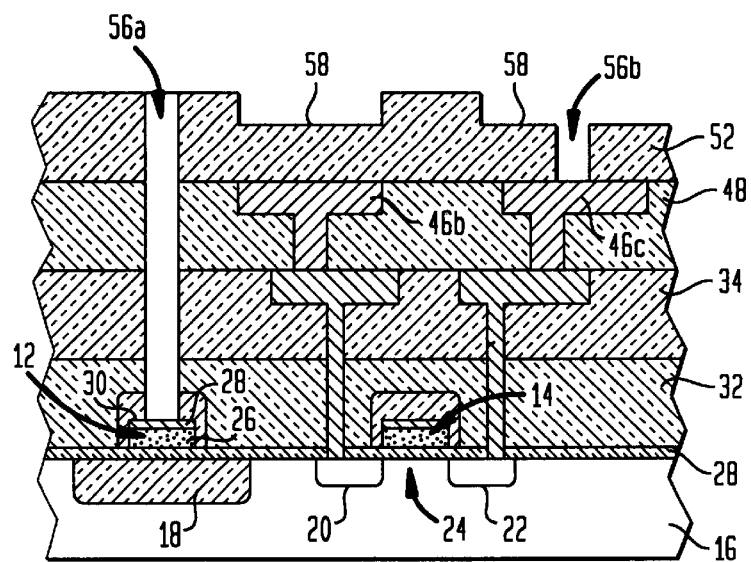

Next, a dielectric layer 52, here TEOS is deposited over the surface of the structure shown in FIG. 1E. The dielectric layer 52 is patterned in a manner similar to that described in connection with FIGS. 1B and 1C. Thus, it is noted that trenches 59 are formed in dielectric layer 52 as shown along with via holes 56a, 56b. One via hole, here via hole 56a, is aligned over the fuse 12 and another one of the via holes, here via hole 56b, is aligned over a portion of one of the source/drain electrical contacts, here over a portion of drain electrical contact 46c. A wet etch, here hydrogen peroxide, is brought into contact with the dielectric layer 52, to the exposed tungsten material 46a deposited onto the fuse 12, and to the exposed portion of drain electrical contact 46c. As noted above, the drain electrical contact 46c is of a material different from the material on the fuse 12, i.e., the former being aluminum and the latter being tungsten. The hydrogen peroxide selectively removes tungsten material 46a (FIG. 1E) without substantial etching of the dielectric TEOS or BPSG layers 52, 48, 34, 32 or the aluminum material 46c. The resulting structure, after the hydrogen peroxide etch, is shown in FIG. 1F, where here optionally, an exposed portion of the silicon nitride layer 30 is removed from an upper portion of the tungsten silicide layer 28 over fuse 12. Some portions of the tungsten silicide may be removed with the hydrogen peroxide. It is noted that removal of the more electrically conductive tungsten silicide results in a more resistive fuse 12 thereby facilitating in the blowing of such fuse when current passes through the doped polycrystalline silicon 26.

As a further option, the sidewall spacers 31 (FIG. 1B) of the silicon nitride may be removed using a chemical dry isotropic, fluoride containing etch to increase the size of the cavity (i.e., the size of the space 64).

Figure 1G:
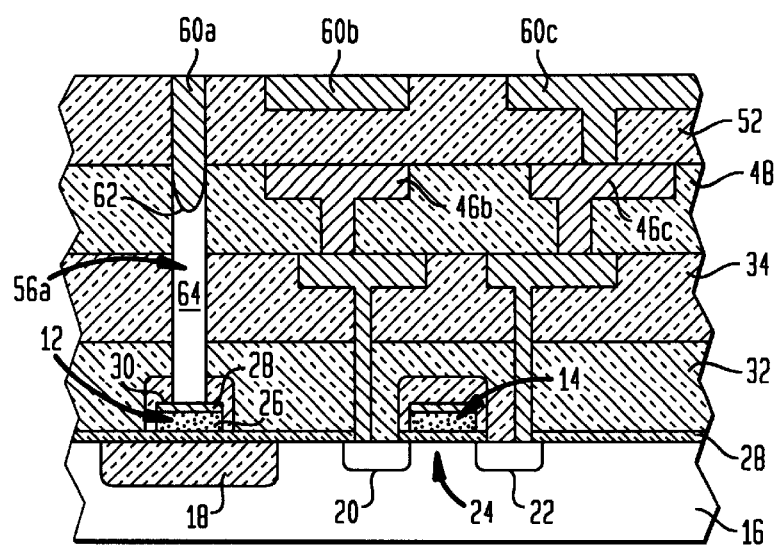

Next,, and referring also to FIG. 1G, a second metalization layer 60a, 60b, 60c, here aluminum, is deposited over the surface of the structure shown in FIG. 1F and then planarized using, for example, CMP, to produce the structure shown in FIG. 1G. Thus, the aluminum 60a in the via hole 56a over the fuse 12 acts as a fill material. Further, because of the high aspect ratio, (e.g., the height of the via hole 56a is 5 times greater than the width of the via hole 56a) the fill material 60a has a bottom portion 62 vertically spaced from the upper surface of the fuse 12. This space 64 thus provides a cavity for fuse material after the fuse 12 is blown.

Other embodiments are within the spirit and scope of the appended claims.

What is claimed is:

1. A method for forming a fuse for a semiconductor integrated circuit, the circuit having an active device, said method comprising the steps of:

forming a fuse and an active device in different regions of a semiconductor substrate;

forming a dielectric layer over the fuse and over the active device;

forming via holes through selected regions of the dielectric layer exposing underlying portions of the fuse and underlying portions of a contact region of the active device;

depositing an electrically conductive material over the dielectric layer and through the via holes onto exposed portions of the fuse and the contact region;

selectively removing portions of the electrically conductive material deposited onto the fuse while leaving portions of the electrically conductive material deposited onto the contact region of the active device;

forming a second dielectric layer over the electrically conductive material;

forming a second via hole through the second dielectric layer expositing an underlying portion of a portion of the electronically conductive material deposited onto the contact region of the active device;

forming a metalization layer over the second dielectric layer of a material different from material of the electrically conductive material, a portion of such metalization layer being deposited through the second via hole onto the exposed underlying portion of the electrically conductive material deposited onto the contact region of the active device; and forming a third via hole through the second dielectric over the fuse and over a portion of the metalization layer.

2. The method recited in claim 1 including the step of bringing an etch into contact with the second dielectric and through the second and third via holes into contact with the exposed portion of the electrically conductive material deposited onto the fuse and into contact with an exposed portion of the metalization layer, such etch selectively removing the exposed portion of the electrically conductive material deposited over the fuse and leaving substantially un-etched the portion of the metalization layer deposited exposed by the second via hole.

3. The method recited in claim 2 including the step of depositing a fill material into an upper portion of the second via hole over fuse with a bottom portion of such filling material being spaced from the fuse.

4. The method recited in claim 3 wherein the electrically conductive material is tungsten.

5. The method recited in claim 4 wherein the metalization layer is aluminum.

6. A method for forming a fuse for semiconductor integrated circuit, such circuit having an active device, such method comprising the steps of:

forming a fuse and an active device in different regions of a semiconductor substrate, such active device having an electrically conductive gate electrode;

forming a dielectric layer over the fuse and over the gate electrode;

forming via holes through selected regions of the dielectric layer exposing underlying portions of the fuse and underlying portions of a source/drain contact region of the active device;

forming a first metalization layer having an electrically conductive material disposed over the dielectric layer and through the via holes, such electrically conductive material having a first portion thereof deposited on the exposed portion of the fuse and a second portion thereof deposited on the exposed portion of the source/drain contact region, such first and second portions being electrically isolated by portions of the dielectric layer;

selectively removing portions of the first portion of the electrically conductive material while leaving substantially the second portion of the electrically conductive material.

7. The method recited in claim 6 including the steps of:

forming a second dielectric layer over the electrically conductive material;

forming a second via hole through the second dielectric layer, such second via hole exposing an underlying portion of the second portion of the electrically conductive material;

forming a second level of metalization over the second dielectric layer, such second level of metalization being of a material different from the electrically conductive material, a portion of such second level of metalization being deposited through the second via onto the exposed underlying second portion of the electrically conductive material.

8. The method recited in claim 7 wherein the step of forming the second via includes the step of forming a via over the first portion of the electrically conductive material to expose an underlying portion of the first portion of the second electrically conductive material.

9. The method recited in claim 8 including the step of bringing an etch into contact with the second dielectric layer and to the exposed first portion of the electrically conductive material and the exposed portion of the second metalization layer, such etch selectively removing the exposed first portion of the electrically conductive material and leaving substantially un-etched the exposed second metalization layer.

10. The method recited in claim 9 including the step of depositing a fill material over fuse with a bottom portion of such filing material being spaced from the fuse.

11. The method recited in claim 10 wherein the electrically conductive material is tungsten.

12. A method for forming a fuse for semiconductor integrated circuit, such circuit having an active device, such method comprising the steps of:

forming a fuse and an active device in different regions of a semiconductor substrate, such fuse and such active device each having an electrically conductive gate electrode;

forming a first dielectric layer over the fuse and over the gate electrode;

forming first via holes through selected regions of the first dielectric layer, such first via holes exposing portions of the fuse and portions of a source/drain contact region of the active device;

forming a first metalization layer having a first electrically conductive material over the first dielectric layer and through the first via holes, such first electrically conductive material having a first portion thereof deposited on the exposed portion of the fuse and a second portion thereof deposited on the exposed portion of the source/drain contact region, such first and second portions being electrically isolated by portions of the first dielectric layer;

forming a second dielectric layer over the first dielectric layer and over the first electrically conductive material;

forming a second via hole through the second dielectric layer, such second via hole exposing a portion of the second portion of the first electrically conductive material;

forming a second metalization layer over the second dielectric layer, such second metalization layer being an electrically conductive material different from the first electrically conductive layer, such second electrically conductive material having a portion thereof passing through the second via hole and onto the exposed portion of the second portion of the first electrically conductive material;

forming a third dielectric layer over the second dielectric layer;

forming a third via hole in portions of the third dielectric layer to expose a portion of the first portion of the first electrically conductive material and a portion of the second metalization layer;

exposing the third dielectric layer to an etch, such etch selectively removing the portions of the first electrically conductive material exposed by the third via hole while leaving substantially un-etched the second metalization layer; and depositing a fill material over the third dielectric layer, such material being deposited in an upper portion of the third via hole, such fill material having a bottom portion spaced from the fuse.

* * * * *